United States Patent [19]
Cameron et al.

[11] Patent Number: 5,545,509
[45] Date of Patent: Aug. 13, 1996

[54] PHOTORESIST COMPOSITION WITH PHOTOSENSITIVE BASE GENERATOR

[75] Inventors: James F. Cameron, Palo Alto, Calif.; Jean M. J. Frechet; Man-Kit Leung, both of Ithaca, N.Y.; Claus-Peter Niesert, San Jose, Calif.; Scott A MacDonald, San Jose, Calif.; Carlton G. Willson, San Jose, Calif.

[73] Assignee: International Business Machines Corporation, Armonk, N.Y.

[21] Appl. No.: 190,716

[22] Filed: Feb. 1, 1994

Related U.S. Application Data

[63] Continuation-in-part of Ser. No. 981,033, Nov. 24, 1992, abandoned.

[51] Int. Cl.$^6$ .................................................. G03C 1/492
[52] U.S. Cl. ................... 430/270.1; 430/280.1; 430/281.1; 430/311; 430/322
[58] Field of Search ..................... 430/270, 280, 430/281, 311, 322, 270.1, 280.1, 281.1

[56] References Cited

U.S. PATENT DOCUMENTS

| | | | |
|---|---|---|---|
| 4,035,189 | 7/1977 | Hayashi et al. | 96/115 R |
| 4,181,531 | 1/1980 | Pilz | 430/270 |
| 4,239,848 | 12/1980 | Adin et al. | 430/270 |
| 4,400,461 | 8/1983 | Chandross et al. | 430/311 |
| 4,456,679 | 6/1984 | Leyrer et al. | 430/326 |
| 4,491,628 | 1/1985 | Ito et al. | 430/176 |
| 4,552,833 | 11/1985 | Ito et al. | 430/325 |
| 4,565,771 | 1/1986 | Lynch et al. | 430/307 |
| 4,657,845 | 4/1987 | Frechet et al. | 430/326 |
| 4,666,820 | 5/1987 | Chandross et al. | 430/270 |
| 4,810,601 | 3/1989 | Allen et al. | 430/18 |
| 4,981,909 | 1/1991 | Babich et al. | 525/102 |
| 5,204,218 | 4/1993 | Kumada et al. | 430/270 |
| 5,206,117 | 4/1993 | Labadie et al. | 430/325 |

FOREIGN PATENT DOCUMENTS

| | | | |
|---|---|---|---|
| 0425142A2 | 10/1990 | European Pat. Off. | G03F 7/004 |
| 0425142 | 5/1991 | European Pat. Off. | G03F 7/004 |
| 03136054 | 6/1991 | Japan . | |
| 92-211570 | 5/1992 | Japan | G03F 7/038 |
| 93-003530 | 11/1992 | Japan | G03F 7/004 |

OTHER PUBLICATIONS

Graziano et al., "Novel Acid-Hardening Positive Photoresist Technology", SPIE vol. 1466, Advances in Resist Technology and Processing VIII (1991).

Matuszczak et al., "Photogenerated Amines and Their Use in the Design of a Positive-tone Resist Material based on Electrophilic Aromatic Substitution", J. Mater. Chem., 1991, 1(6), 1045–1050.

Winkle et al., "Acid Hardening Positive Photoresist using Photochemical Generation of base", Journal of Photopolymer Science and Technology, vol. 3, No. 3 (1990) pp. 419–422.

Ito et al., "Photo-Initiated Amine-Formation in a Polymer Matrix and Its Application to Thermal Cross-Linking of Poly(Glycidyl Methacrylate) Films", Chemistry Letters, pp. 1153–1156, 1992, The Chemical Society of Japan.

Kutal et al., "Photoinitiated Cross-Linking and Image Formation in Thin Polymer Films Containing a Transition Metal Compound", J. Electrochem. Soc., solid-State Science and Technology, Sep. 1987.

Song et al., "Crosslinking of 2,3-Epoxypropyl Methacrylate Copolymer Films by the Use of Photochemically Produced Pendent Amino Groups", Journal of Polymer Science: Part C: Polymer Letters, vol. 25, 417–421 (1987).

McKean et al., "Base-Catalyzed Photosensitive Polyimide", Polym. Mater. Sci. & Engr., 66, 237 (1992).

MacDonald et al., "A Positive Tone Plasma-Developable Resist Obtained by Gas-Phase Image Reversal", Chem. Mater., vol. 4 No. 6 (1992).

MacDonald et al., "A New Oxygen Plasma Developable UV Sensitive Resist", Society of Plastics Engineers, Inc., Oct. 28, 29, 30, 1985.

MacDonald et al., "Plasma-Developable Photoresist Systems Based on Chemical Amplification", Chem. Mater., vol. 3, 1991.

Cameron et al., "Photogeneration of Organic Bases from O-Nitrobenzyl-Derived Carbamates", J. Am. Chem. Society, vol. 113, No. 11, 1991.

Taylor et al., "Gas-Phase-Functionalized Plasma-Developed Resists:Initial Concepts and Results for Electron-Beam Exposure", J. Electrochem. Soc.: Solid-State Science and Technology, Jul. 1984.

*Primary Examiner*—Mark Chapman
*Attorney, Agent, or Firm*—Robert B. Martin

[57] ABSTRACT

The present invention relates to an improved lithographic photoresist composition comprising a photosensitive base generator. The composition is useful in the manufacture of integrated circuits.

7 Claims, No Drawings

PHOTORESIST COMPOSITION WITH PHOTOSENSITIVE BASE GENERATOR

This is a continuation-in-part of application Ser. No. 07/981,033 filed on Nov. 24, 1992, now abandoned.

FIELD OF THE INVENTION

The present invention relates to an improved lithographic photoresist composition for use in the manufacture of integrated circuits.

BACKGROUND OF THE INVENTION

There is a desire in the industry for higher circuit density in microelectronic devices which are made using lithographic techniques. One method of increasing the number of components per chip is to decrease the minimum feature size on the chip, which requires higher lithographic resolution. The use of shorter wavelength radiation (e.g. deep UV e.g. 190 to 315 nm) than the currently employed mid-UV spectral range (e.g. 350 nm to 450 nm) offers the potential for higher resolution. However, with deep UV radiation, fewer photons are transferred for the same energy dose and higher exposure doses are required to achieve the same desired photochemical response. Further, current lithographic tools have greatly attenuated output in the deep UV spectral region.

In order to improve sensitivity, several acid catalyzed chemically amplified resist compositions have been developed such as those disclosed in U.S. Pat. No. 4,491,628 (Jan. 1, 1985) and Nalamasu et al., "An Overview of Resist Processing for Deep-UV Lithography", J. Photopolym Sci. Technol. 4,299 (1991). The resist compositions generally comprise a photosensitive acid generator and an acid sensitive polymer. The polymer has acid sensitive side chain (pendant) groups which are bonded to the polymer backbone and are reactive towards a proton. Upon imagewise exposure to radiation, the photoacid generator produces a proton. The resist film is heated and, the proton causes catalytic cleavage of the pendant group from the polymer backbone. The proton is not consumed in the cleavage reaction and catalyzes additional cleavage reactions thereby chemically amplifying the photochemical response of the resist. The cleaved polymer is soluble in polar developers such as alcohol and aqueous base while the unexposed polymer is soluble in nonpolar organic solvents such as anisole. Thus the resist can produce positive or negative images of the mask depending on the selection of the developer solvent.

Although these resist compositions generally have suitable lithographic sensitivity, their performance can be impaired in the presence of airborne basic chemical contaminants which are present in a manufacturing site. MacDonald et al. SPIE 1466 2. (1991) reported that due to the catalytic nature of the imaging mechanism, acid catalyzed, chemically amplified resist systems are sensitive towards minute amounts of airborne basic organic chemical contaminants. These substances degrade the resulting developed image in the film and cause a loss of the linewidth control of the developed image. This problem is exaggerated in a manufacturing process where there is an extended and variable period of time between applying the film to the substrate and development of the image. In order to protect the resist from such airborne contaminants, the air surrounding the film is carefully filtered to remove such substances. Alternatively, the resist film is overcoated with a protective polymer layer. However, these are cumbersome processes.

Therefore, there still is a need in the art for a chemically amplified photoresist composition having stability in the presence of airborne basic chemical contaminants for use in semiconductor manufacturing.

It is therefore an object of the present invention to provide an improved chemically amplified photoresist composition for use in semiconductor manufacturing.

Other objects and advantages will become apparent from the following disclosure.

SUMMARY OF THE INVENTION

The present invention relates to a polymeric photosensitive resist composition comprising (i) a photosensitive base generator (ii) a polymer and (iii) a base labile compound. The base labile compound is preferably chemically bonded to the polymer. Upon exposure to base, the base labile compound undergoes a polarity change which results in dissolution differentiation. The base labile compound is preferably a compound having a base cleavable carboxy group. The resist has good solubility and adhesion, high lithographic sensitivity, high contrast and is dry or solvent developable. The resist also exhibits enhanced stability in the presence of airborne basic chemical contaminants. The photoresist composition of the present invention is useful in semiconductor manufacturing to make integrated circuit chips. The present invention also relates to the process for making a resist image on a substrate using the resist composition of the present invention. The present invention also relates to an integrated circuit formed using the composition and process of the present invention.

A more thorough disclosure of the present invention is presented in the detailed description which follows.

DETAILED DESCRIPTION OF THE INVENTION

The present invention relates to a base catalyzed, chemically amplified, polymeric photosensitive resist composition comprising (i) a photosensitive base generator (ii) a polymer and (iii) a base labile compound. Preferably the base labile compound is chemically bonded to the polymer and preferably is a compound having a base cleavable substituent such as a carboxy group. As used herein carboxy shall mean —COOH.

The base cleavable substituent is bonded to the base labile compound through a base cleavable carbon-carbon, carbon-nitrogen or carbon sulfur bond which is cleaved by photogenerated base. Suitable base cleavable carbon-carbon bonds are formed when carboxy is bonded to a sterically hindered or electron deficient carbon atom. Suitable compounds having base clearable carbon-nitrogen bonds are (i) 2-amino aliphatic carboxylic acid esters such as 2-(alkylamino) or 2-(phenylamino)-propanoic acid ester or (ii) 2-(alkylamino) or 2-(phenylamino) ethyl sulfones ($R_2N(CH_2)_2SO_2R'$) both of which undergo base cleavage of the carbon-nitrogen bond via a retro-Michael type reaction. Suitable compounds having base clearable carbon-sulfur bonds include keto sulfones such as ($RCO(CH_2)_2SO_2R'$) which undergoes base cleavage of the carbon sulfur bond (carbon-sulfonyl bond) via a retro-Michael type reaction. For the amino and keto sulfones, the R and R' can be selected from alkyl preferably lower alkyl $C_{1-6}$ or aryl preferably phenyl optionally substituted with substituents which do not unacceptably interlet with the resist process. Other suitable base cleavable carbon-carbon, carbon-nitrogen or carbon-sulfur bonds are known to those skilled in the art. Suitable polymers for bonding to the base labile compound include polystyrene, and copolymers thereof, polyacrylates and polymethacrylates, novolac, maleimide-styrene or hydroxystyrene-styrene copolymers, polyamic acids or polyamic esters or polyimides. The preferred polymer is a polystyrene having the base cleavable carboxy group chemically bonded to the aromatic ring. Preferred base cleavable carboxy subsituents include the following:

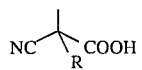

1)

R = H, alkyl, Aryl

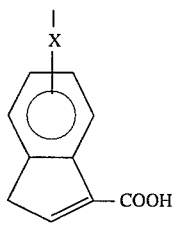

2)

X = $CO_2$, $SO_3$, Aryl, alkyl

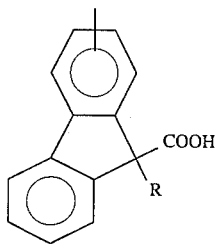

3)

R = H, Alkyl, Aryl, S-Aryl

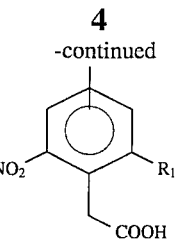

4)

$R_1$ = $NO_2$, H

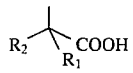

5)

$R_1$ = H, Alkyl, Aryl
$R_2$ = $RSO_2$, RCO, $(NO_2)_n$Aryl

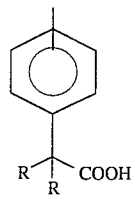

6)

R = F, $CF_3$, S Alkyl, S Aryl

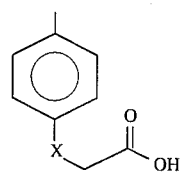

7)

X = $SO_2$, CO, SO

Preferred polymers having pendant base labile substituents with base cleavable carboxy groups include

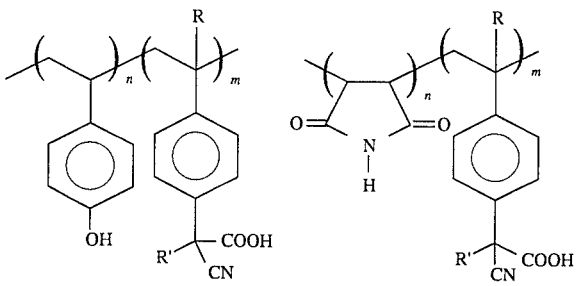

-continued
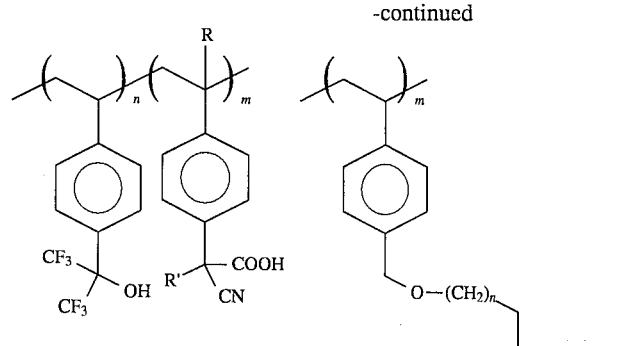
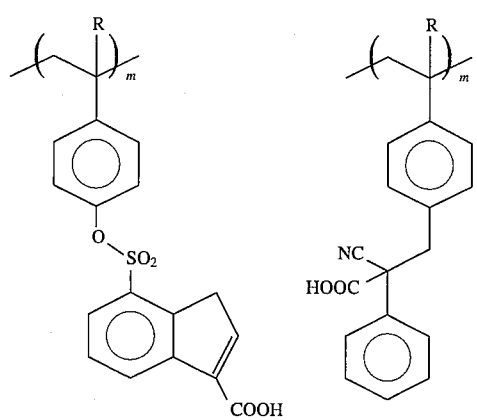
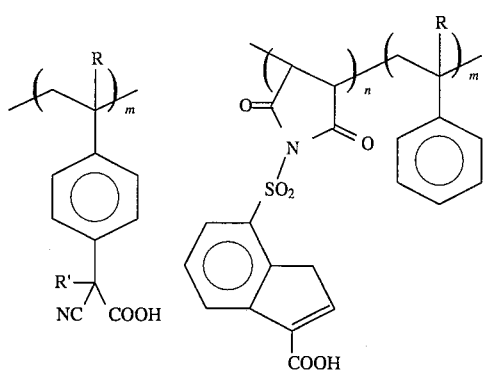
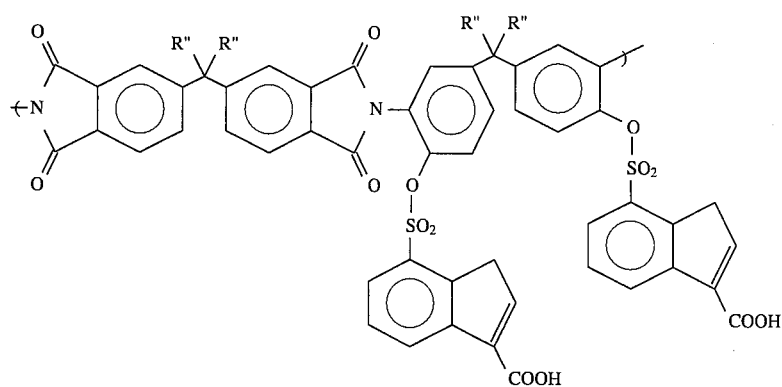

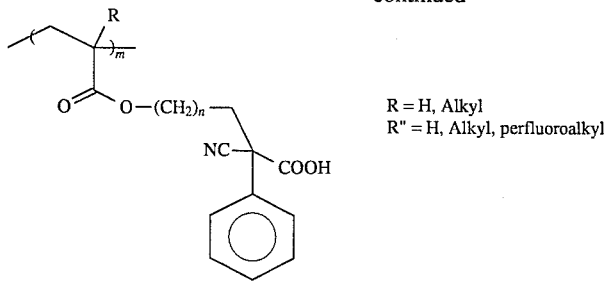

R = H, Alkyl
R" = H, Alkyl, perfluoroalkyl

A preferred polymer for the present invention is poly(cyanocarboxyalkyl styrene) and copolymers thereof. Upon exposure to photogenerated base, the pendant polar carboxy groups are cleaved from the polymer to form non-polar recurring units on the polymer backbone resulting in dissolution differentiation to enable development of the exposed image.

In an alternative embodiment of the process of the present invention, the base labile compound is disposed in a polymer matrix such as a base soluble polymer like poly(hydroxystyrene), novolac or the following:

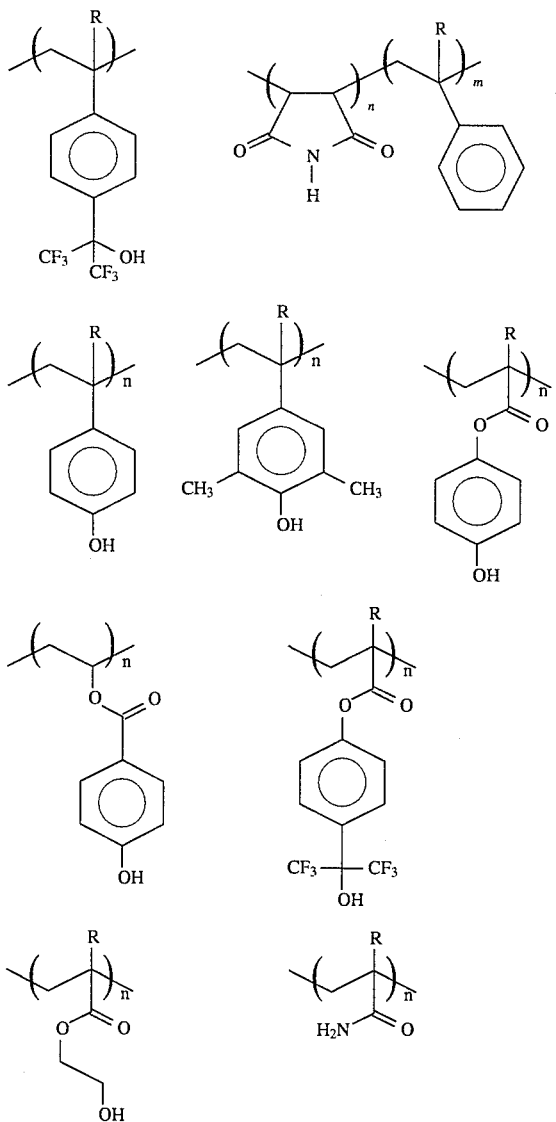

-continued

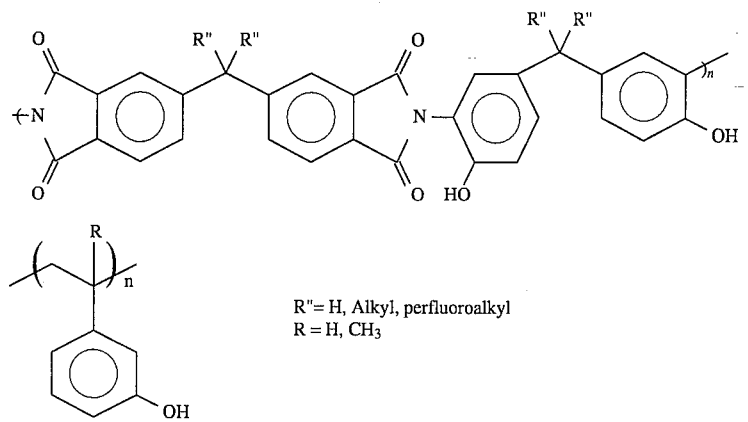

R" = H, Alkyl, perfluoroalkyl
R = H, CH₃

Preferably, the base soluble polymer is transparent in the UV. Preferred base soluble polymers are vinyl polymers such as poly(hydroxystyrene).

Suitable base labile compounds with base cleavable carboxy groups include the following:

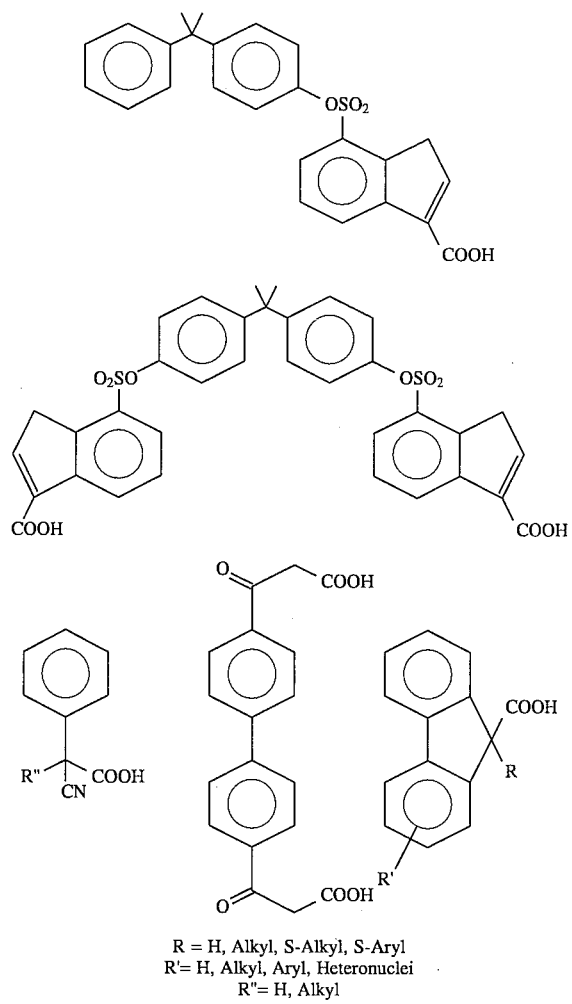

R = H, Alkyl, S-Alkyl, S-Aryl
R' = H, Alkyl, Aryl, Heteronuclei
R" = H, Alkyl

The compound either enhances or does not effect the dissolution property of the base soluble polymer matrix in the lithographic process. The base-catalyzed cleavage of the carboxy group from the compound converts the compound into dissolution inhibitor enabling the development of negative images with aqueous base.

Suitable photosensitive base generators for use in the compositions of the present include benzyl carbamates (e.g. amines protected by a benzyloxycarbonyl substituent), benzyl sulfonamides, benzyl quaternary ammonium salts, imines, iminium salts and

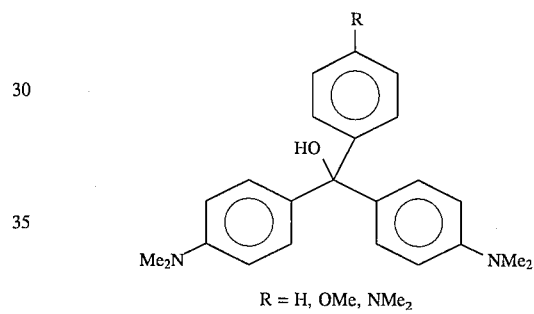

R = H, OMe, NMe₂

Other photosensitive base generators suitable for use in the present invention will be known to those skilled in the art such as those disclosed in "Base Catalysis in Imaging Materials", by J. Frechet et al. J. Org. Chem. 1990, 55, 5919; "Acid Hardening Positive Photoresist Using Photochemical Generation of Base" by Winkle et al. J. of Photopolymer Sci. and Tech. 3, 1990, 419, and "Synthetic Organic Photochemistry" by Horspool, Plenum Press 198- the disclosures of which are incorporated herein by reference. Preferred photobase generators include bis[(2,6-dinitrobenzyl) oxycarbonyl] hexane-1, 6 diamine, N-(2-nitrobenzyloxycarbonyl)-cyclohexylamine, N-[[(2-nitrophenyl)-1-methylmethoxy] carbonyl]decylamine, N-[[1-93,5-dimethoxyphenyl)-1-methyl-ethoxy]-carbonyl]cyclohexylamine or the corresponding bis-carbamate of 1,6-diaminohexane, 1,1-bis(4-dimethylaminophenyl)-1-phenyl-methanol and analogous substituted triphenyl methanol. Conveniently, the photosensitive generator will absorb light in the 200–350 nm region to generate the base.

The process of the present invention for making a resist image on a substrate comprises three steps. The first step of the process involves coating the substrate with a polymeric film comprising a photosensitive base generator (ii) a polymer and (iii) a base labile compound all dissolved in a suitable solvent. Suitable substrates are comprised of silicon, ceramics, polymer or the like. Suitable organic casting solvents include diglyme, methyl cellosolve acetate, cyclohexanone, propylene glycol monmethyl ether acetate, ethyl lactate and the like. The film will preferably comprise about 80 to about 99.5 weight % of the polymer having pendant base cleavable substituents and about 20 to about 0.5 weight % of the photobase generator both dissolved in the organic solvent. Optionally, the film can contain additives such as polymers and small molecules to adjust the films dissolution rate, etch resistance, optical density, radiation sensitivity, adhesion and the like. The film can be coated on the substrate using art known techniques such as spin or spray coating, doctor blading or electrodeposition. After the film is coated on the substrate, it can optionally be heated to a low temperature to remove the solvent from the film.

In the second step of the process, the film is imagewise exposed to a low dose of radiation suitably electromagnetic or electron beam radiation preferably electromagnetic, preferably deep ultraviolet or x-ray more preferably deep ultraviolet radiation at a wavelength of about 190 to 315 nm more preferably at a wavelength of about 250 nm. Suitable radiation sources include mercury, mercury/xenon, and xenon lamps, excimer laser, electron beam or x-ray. Generally the deep U.V. exposure is less than 100 millijoule/cm$^2$ preferably less than 50 millijoule/cm$^2$. Generally, the exposure of the film is at ambient temperature. In the exposed areas of the film, the photosensitive base generator produces free base. However, because the radiation dose is so low, there is essentially negligible radiation induced cleavage of the cleavable base group and negligible radiation induced main chain scission decomposition of the polymer.

The free base causes bases catalyzed cleavage of the bond attaching the base cleavable substituent to the base labile compound. Preferably, the base cleavable substituent is carboxy which forms carbon dioxide in the exposed areas upon cleavage. The base is not consumed in the cleavage reaction and catalyzes additional cleavage reactions to chemically amplify the photochemical response of the resist. After the exposure, the film is preferably heated again to an elevated temperature, preferably to a temperature of about 100° C. to about 150°, more preferably to a temperature of about 110° C. to about 130° C. The post-exposure heating enhances the base catalyzed cleavage of the carboxy groups. The cleavage of the carboxy groups alters the dissolution rate of the polymer and the resulting differential solubility between the exposed and unexposed areas of the film enables development of the image in the film.

The last step of the process of the present invention involves development of image in the film. Suitable development techniques are known to those skilled in the art. The image can be solvent developed preferably in an aqueous base solvent without metal ions such as aqueous tetraalkyl ammonium hydroxide to produce a negative tone image. The image in the film has high resolution and straight side walls. Alternatively, the image can be dry developed. After exposure, the film is contacted with an organometallic compound disposed in the gas phase or in solution. Preferred organometallic compounds are organosilicon and organostannyl compounds including, for example, dimethylaminotrimethylsilane, hexamethyldisilazane, trimethylsilyl chloride, trimethyl stannyl chloride, dimethyl stannyl chloride, and 1,1,3,3,5,5 hexamethylcyclotrisilazane. Other organometallic compounds will be known to those skilled in the art. The carboxy groups in the unexposed portion of the film will react with the organometallic compound to form a material which is resistant to reactive ion etching. The exposed portion of the film does not react with the organometallic compound and these portions of the film are susceptible to reactive ion etching. The film is then dry developed with plasma etching or reactive ion etching to give a positive tone image.

The present invention also relates to an integrated circuit made by the process of the present invention such as a circuit chip or semiconductor device comprising a circuit made by the steps of:

a. coating the substrate with a film comprising (i) a photosensitive base generator (ii) a polymer and (iii) a base labile compound;

b. imagewise exposing the film to radiation to generate a base;

c. developing the image to expose the substrate; and d. forming the circuit in the developed film on the substrate by art known techniques.

After the substrate has been exposed by development, circuit patterns can be formed in the exposed areas by coating the substrate with a conductive material such as conductive metals by art known techniques such as evaporation, sputtering, chemical vapor deposition or laser induced deposition. Dielectric materials may also be deposited by similar means during the process of making circuits. Inorganic ions such as boron, phosphorous or arsenic can be implanted in the substrate in the process for making p or n doped circuit transistors. Other means for forming circuits will be known by those skilled in the art.

The following examples are detailed descriptions of methods of preparation and use of the process of the present invention. The detailed preparations fall within the scope of, and serve to exemplify, the more generally described methods set forth above. The examples are presented for illustrative purposes only, and are not intended as a restriction on the scope of the invention.

EXAMPLE 1

Preparation of p-vinylbenzyl cyanide

To a solution of sodium cyanide (19 g, 0.33 mol) in H$_2$O was added dropwise a solution of p-vinylbenzyl chloride(1) (40 g, 0.26 mmol) in ethanol (50 mL). After addition, the reaction mixture was heated to reflux for 5.5 h, cooled and filtered to remove most of the sodium chloride. The filtered salt was washed with small portion of ethanol and discarded. The ethanol in the filtrate was removed by simple distillation. The residue liquid is cooled and extracted with diethyl ether three times. The combined extracts were then washed with saturated sodium chloride solution, dried over anhydrous sodium sulfate and concentrated under reduced pressure.

EXAMPLE 2

Preparation of 2-cyano-2-(p-vinylphenyl)-butanoic acid

To a one-necked round-bottom flask, equipped with a condenser, was added a solution of sodium hydroxide (10.2 g, 0.23 mol in 20 mL of water), ethyl bromide (13.8 g, 0.128 mol), p-vinylbenzyl cyanide (2) (10 g, 70 mmol) and benzyltrimethylammonium chloride (0.2 g, 0.85 mmol). The mixture was stirred at ambient temperature for 24 h and another portion of ethyl bromide (14 g, 0.13 mmol) was added. The mixture was further stirred for 30 h until all the p-vinylbenzyl cyanide was consumed. A portion of diethyl ether (30 mL) was added and the organic layer was separated and quenched with an ice-cooled diluted HCl (8%). The organic layer was extracted with diethyl ether, dried over anhydrous MgSO$_4$ and concentrated to provide a mixture of monoethylated product (86%) and bisethylated product (14%). The crude mixture was used in the following synthesis without being further purified.

To a solution of diisopropylamine (12.6 g, 0.125 mol) in THF (50 mL) at −78° C. was added, under nitrogen, a solution of n-BuLi (1.6 M in hexanes, 78 mL, 0.125 mol). The solution was stirred at −78° C. for 2 h and a solution of 2-(p-vinylphenyl)-butyronitrile (86% pure, 12.4 g, 0.061 mol) in THF (50 mL) was added dropwise. After addition, the reaction mixture was stirred at −78° C. for 3 h and poured onto granulated dry-ice (300 g). The slurry was kept under nitrogen and warmed up slowing until almost all the dry-ice was consumed. The mixture was then quenched with diluted HCl (8%) and extracted with diethyl ether twice. The combined etheral extracts were washed with water and extracted twice with diluted KOH (5%). The combined aqueous extracts, which containing the desired carboxylic acid were then neutralized and extracted with diethyl ether. The etheral extracts were dried over anhydrous sodium sulfate and concentrated under reduced pressure to provide a pale-yellow solid (9.5 g, 73%). The crude solid was recrystallized in a mixture of dichloromethane-hexanes to provide an essentially pure 2-cyano-2-(p-vinylphenyl)-butanoic acid (7.8 g, 60%).

EXAMPLE 3

Preparation of t-butyl 2-cyano-2-(p-vinylphenyl)-butyrate

To an ice-cooled solution of 2-cyano-2(p-vinylphenyl)-butanoic acid (3 g, 0.014 mol) in benzene (100 mL) was added oxalyl chloride (5.3 g, 0.042 mol). The solution was cooled in an ice-bath and five drops of DMF was added to catalyze the acyl chloride formation. After being stirred at room-temperature for 4 h, all the solvent and excess oxalyl chloride was removed under reduced pressure. The crude acyl chloride was then taken up with small amount of benzene, filtered, concentrated, re-dissolved in $CH_2Cl_2$ (10 mL) and cooled in an ice-bath. To the solution, solutions of pyridine (3.2 g 0.042 mol) in $CH_2Cl_2$ and tert-butanol (5.2 g, 0.07 mol) in $CH_2Cl_2$ (5 mL) were added. After addition, the solution mixture was stirred at room-temperature for 6 h and quenched with diluted HCl (1%, 500–600 mL). The organic layer was separated, washed and saturated $K_2CO_3$ and NaCl solutions, dried over anhydrous $Na_2SO_4$, concentrated under reduced pressure and purified by liquid chromatography on silica gel with EtOAc-hexanes (1:9) as an eluent to provide an essentially pure product (2.6 g, 70%).

EXAMPLE 4

Preparation of poly(t-butyl 2-cyano-2-(p-vinylphenyl)butyrate)

t-Butyl 2-cyano-2-(p-vinylphenyl)butyrate (2.54 g, 9.04 mmol) was polymerized in toluene (5 mL) in the presence of AIBN (0.031 g, 0.18 mmol) at 73–78° C. for 18 h. The crude polymer toluene was precipitated in hexanes (200 mL), re-dissolved in chloroform and re-precipitated in methanol to provide poly(t-butyl 2-cyano-2-(p-vinylphenyl) butyrate) (1.83 g, 74%).

Preparation of poly(2-cyano-2-(p-vinyiphenyl) butanoic acid)

Poly(t-butyl 2-cyano-2-(p-vinylphenyl) butyrate) (5) (0.95 g) was added to a solution of trifluoroacetic acid in dichloromethane (60%). After being stirred at room temperature for 5.5 h, the solution was concentrated under reduced pressure to obtain a slightly yellowish solid. The crude carboxylic acid polymer was then re-dissolved in acetone and re-precipitated in pentane twice and kept under vacuum for three days to obtain a trifluoroacetic acid free poly(2-cyano-2-(p-vinylphenyl) butanoic acid) (6) (0.73 g, 96%).

EXAMPLE 6

Lithography

A base-soluble resist solution with a formulation consisting of poly(2-cyano-2-(p-vinylphenyl) butanoic acid) (238.4 mg) and bis[[(2,6-dinitrobenzyl)oxyl]-carbonyl]hexane-1,6-diamine (24 mg) in diglyme (950 mg) was spun and prebaked at 110° C. for 2 min to give films with 1.0 micron thickness. After exposure with DUV light at 254 nm and postbaking at 120° C. to 135° C. for 5 min, the films were developed by immersion in a diluted AZ312MIF developer (0.25%V/V) to give the following sensitivity and contrast values.

| Postbake Temperature (°C.) | Sensitivity $mJ/cm^2$ | Contrast |
| --- | --- | --- |
| 135 | 1.4 | 13.7 |
| 130 | 5.2 | 5.2 |
| 125 | 8.8 | 11.8 |
| 120 | 13.6 | 12.6 |

EXAMPLE 7

Lithography

A base-soluble resist solution with a formulation consisting of of poly(2-cyano-2-(p-vinylphenyl) butanoic acid) (109.8 mg) and bis[[(2,6-dinitrobenzyl)oxy]-carbonyl]hexane-1,6-diamine (10.8 mg) in diglyme (458.3 mg) was spun and prebaked at 110° C. for 2 min to give films with 1.0 micron thickness. After exposure with DUV light at 254 nm, postbaked at 125° C. for 14 min, dipped into water for 30 sec, developed by immersion of the film in a solution of triethanolamine (1.04 g/L) and rinsed with water, the sensitivity of the resist was determined as 6.4 $mJ/cm^2$ with a contrast value of 8.7.

EXAMPLE 8

Lithograph with Dry Development

Generally following the procedure of Example 7 using 4,5 dimethoxy, 2-cyclohexylamino carbonyl oxy-1'-ethyl) nitrobenzene as a photobase generator, a film was formed on a substrate, exposed to 254 nm (100 $mJ/cm^2$) light and bake at 120° C. for 10 min. The film was then silylated with dimethylaminotrimethyl silane for 5 min (80° C./200 torr). The film was then etched with oxygen for 2.75 min in a magnetically enhanced RIE (1 mtorr/10 sccm oxygen/0.5 kWRF) to form 1.5 micron positive images.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

We claim:

1. A photosenstive resist composition comprising (i) a photosensitive base generator, (ii) a polymer and (iii) a base labile compound having a base cleavable substituent which is bonded to the base labile compound through a base-cleavable carbon-carbon, bond.

2. The composition of claim 1 wherein the base cleavable substituent is a carboxy group.

3. The composition of claim 2 wherein the base labile compound is bonded to the polymer.

4. The composition of claim 3 wherein the base generator is a benzyl carbamate.

5. A photosensitive resist composition comprising a photosensitive base generator and a polymer having pendant base labile substituents with base cleavable groups which are bonded to the base labile substituents through base cleavable carbon-carbon, bonds.

6. The composition of claim 5 wherein the polymer is poly(cyanocarboxyalkylstyrene).

7. The composition of claim 6 wherein the base generator is benzyl carbamate.

* * * * *